United States Patent
Tan et al.

(10) Patent No.: US 9,542,761 B2
(45) Date of Patent: Jan. 10, 2017

(54) GENERALIZED APPROXIMATE MESSAGE PASSING ALGORITHMS FOR SPARSE MAGNETIC RESONANCE IMAGING RECONSTRUCTION

(71) Applicants: Jin Tan, Raleigh, NJ (US); Boris Mailhe, Plainsboro, NJ (US); Qiu Wang, Princeton, NJ (US); Mariappan S. Nadar, Plainsboro, NJ (US)

(72) Inventors: Jin Tan, Raleigh, NJ (US); Boris Mailhe, Plainsboro, NJ (US); Qiu Wang, Princeton, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 59 days.

(21) Appl. No.: 14/630,712

(22) Filed: Feb. 25, 2015

(65) Prior Publication Data
US 2016/0247299 A1    Aug. 25, 2016

(51) Int. Cl.
*G06K 9/00* (2006.01)
*G06T 11/00* (2006.01)
*G06T 7/00* (2006.01)
*A61B 6/00* (2006.01)

(52) U.S. Cl.
CPC .......... *G06T 11/003* (2013.01); *G06T 7/0012* (2013.01); *G06T 2207/10088* (2013.01)

(58) Field of Classification Search
USPC ................ 382/100, 103, 128–134, 154, 162, 168,382/173, 181, 224, 232, 254, 274, 276, 280,382/286–291, 305, 312, 172; 378/4, 21; 250/208.1; 706/12
See application file for complete search history.

(56) References Cited

U.S. PATENT DOCUMENTS

| | | | |
|---|---|---|---|
| 8,825,566 B2* | 9/2014 | Jebara ................. | G06K 9/6297 706/12 |
| 2013/0028496 A1* | 1/2013 | Panin ................... | G06T 11/006 382/131 |
| 2014/0263963 A1* | 9/2014 | Broxton ............... | G02B 21/367 250/208.1 |
| 2015/0016682 A1* | 1/2015 | Levy ...................... | A61N 7/02 382/103 |
| 2015/0187052 A1* | 7/2015 | Amroabadi .......... | A61B 6/5205 382/131 |

* cited by examiner

*Primary Examiner* — Seyed Azarian

(57) ABSTRACT

A method for reconstructing magnetic resonance imaging data includes acquiring a measurement dataset using a magnetic resonance imaging device and determining an estimated image dataset based on the measurement dataset. An iterative reconstruction process is performed to refine the estimated image dataset. Each iteration of the iterative reconstruction process comprises: updating the measurement dataset and a sparse coefficient dataset based on the estimated image dataset and a plurality of belief propagation terms, incorporating a noise prior dataset into the measurement dataset, incorporating a sparsity prior dataset into the sparse coefficient dataset, updating the plurality of belief propagation terms based on the measurement dataset and the sparsity prior dataset, and updating the estimated image dataset based on the plurality of belief propagation terms. A reconstructed image and confidence map are generated using the estimated image dataset.

17 Claims, 9 Drawing Sheets

GENERALIZED APPROXIMATE MESSAGE PASSING ALGORITHMS FOR SPARSE MAGNETIC RESONANCE IMAGING RECONSTRUCTION

TECHNOLOGY FIELD

The present invention relates generally to methods, systems, and apparatuses for performing Magnetic Resonance Imaging (MRI) reconstruction using Generalized Approximate Message Passing (GAMP) techniques. Aside from MRI, the disclosed methods, systems, and apparatuses may be applied generally to various image reconstruction applications where sparse sampling techniques are used.

BACKGROUND

In Magnetic Resonance Imaging (MRI), images are reconstructed from k-space measurements. Because images are usually highly compressible in some transform domain, one can "compress" or undersample the measurements before reconstruction. This process of reconstructing images from very few measurements is referred to as "Compressed Sensing (CS)." Compressed Sensing is a preferred technique for acquiring MRI images because it reduces the time of acquiring measurements, and thus patients receive much less radiation compared to other acquisition techniques.

Conventional Compressed Sensing (CS) techniques are based on convex optimization algorithms such as Fast Iterative Soft-Thresholding (FISTA) or Alternating Direction Method Of Multipliers (ADMM). Those algorithms usually solve the problem from maximum a posteriori (MAP) point of view and do not provide any information about the confidence of the reconstruction—i.e., the measure of differences between the reconstructed image and the ground-truth. However, confidence information would greatly aid in the diagnosis process. For example, such information would allow physicians to quickly access whether a particular item in an image is anatomical in nature (e.g., a lesion) or if it is merely potential artifact. Additionally, confidence information can be used to optimize the reconstruction itself, by providing a measure of how many iterations are needed to provide fidelity in the area of interest. Accordingly, it is desired to create a reconstruction technique suitable for Compressed Sensing (CS) application that produces both the reconstructed image, along with measure of confidence in the reconstructed data.

SUMMARY

Embodiments of the present invention address and overcome one or more of the above shortcomings and drawbacks, by providing methods, systems, and apparatuses related to a Generalized Approximate Message Passing (GAMP) Algorithms for sparse Magnetic Resonance Imaging Reconstruction applications. The proposed schemes provide several benefits over conventional reconstruction applications, including the ability to generate confidence maps corresponding to reconstructed image data.

According to some embodiments, a method for reconstructing magnetic resonance imaging data includes acquiring a measurement dataset using a magnetic resonance imaging device and determining an estimated image dataset based on the measurement dataset. An iterative reconstruction process is performed to refine the estimated image dataset. Each iteration of the iterative reconstruction process comprises: updating the measurement dataset and a sparse coefficient dataset based on the estimated image dataset and belief propagation terms, incorporating a noise prior dataset into the measurement dataset, incorporating a sparsity prior dataset into the sparse coefficient dataset, updating the belief propagation terms based on the measurement dataset and the sparsity prior dataset, and updating the estimated image dataset based on the belief propagation terms. A reconstructed image and confidence map are generated using the estimated image dataset.

In some embodiments, the measurement dataset described in the aforementioned method comprises mean measurement data and variance measurement data. Updating measurement dataset based on the estimated image dataset and the plurality of belief propagation terms in the aforementioned method may then include determining the mean measurement data based on a mean of the estimated image dataset and determining the variance measurement data based on a variance of the estimated image dataset and one or more of the belief propagation terms. In some embodiments, the noise prior dataset is incorporated into the measurement dataset using a maximum a posteriori probability (MAP) estimation process.

In some embodiments, the sparse coefficient dataset described in the aforementioned method comprises mean sparse coefficient data and variance sparse coefficient data. The sparse coefficient dataset may then be updated based on the estimated image dataset and the belief propagation terms by determining the mean sparse coefficient data based on a mean of the estimated image dataset; and determining the variance sparse coefficient data based on a variance of the estimated image dataset and one or more of the belief propagation terms. In some embodiments, the sparsity prior dataset is incorporated into the sparse coefficient dataset by updating the mean sparse coefficient data using a soft thresholding operator applied to the mean sparse coefficient data and updating the variance sparse coefficient data using a derivative soft thresholding operator applied to the mean sparse coefficient data.

In some embodiments, the estimated image dataset described in the aforementioned method comprises mean estimated image data and variance estimated image data. The estimated image dataset may then be updated based on the belief propagation terms by updating the mean estimated image data using a first transform operator applied to a first belief propagation term and a second transform operator applied to a second belief propagation term. The variance estimated image data is updated by applying the first transform operator to a third belief propagation term and the second transform operator to a fourth belief propagation term and multiplying by the mean estimated image data. In one embodiment, the first transform operator is an adjoint of a Fourier transform operator and the second transform operator is an adjoint of a wavelet transform operator. In one embodiment, the reconstructed image is generated based on the mean estimated image data and the confidence map is generated based on the variance estimated image data.

Various types of belief propagation terms may be used in the aforementioned method. For example, in some embodiments, the belief propagation terms used in the method include a first belief propagation term corresponding to mean measurement data, a second belief propagation term corresponding to variance measurement data, a third belief propagation term corresponding to mean sparse coefficient data, and a fourth belief propagation term corresponding to variance sparse coefficient data.

According to other embodiments, a method for reconstructing magnetic resonance imaging data comprises obtaining k-space scan data captured by a MRI system and representative of an undersampled region over time. Then, an image dataset is reconstructed from the k-space scan data by applying generalized approximate message passing (GAMP) to solve an optimization problem which applies a Fourier transform and a wavelet transform to the k-space scan data. In some embodiments, the image dataset comprises a reconstructed image and a mean squared error (MSE) map. GAMP may be implemented in a variety of ways in different embodiments. For example, in one embodiment, GAMP is applied to solve the optimization problem by first determining image distribution values based on the k-space scan data. Measurement coefficient values are determined using the plurality of image distribution values and a first belief propagation correction term. A first prior data value is incorporated into measurement coefficient values and sparse coefficient values are determined using the image distribution values and a second belief propagation correction term. A second prior data value is incorporated into the sparse coefficient values and the image distribution values are updated based on the measurement coefficient values and the sparse coefficient values. In some embodiments, the first prior data value is incorporated into the measurement coefficient values using a maximum a posteriori (MAP) probability estimate. In one embodiment, the first prior data value comprises a Gaussian distribution of a noise and the second prior data value comprises a Laplacian distribution of a regularization term.

According to other embodiments, a system for reconstructing magnetic resonance imaging data includes an imaging device and a central control computer unit. The imaging device comprises a plurality of coils configured to acquire k-space scan data representative of an undersampled region over time. The central control computer unit is configured to reconstruct an image dataset from the k-space scan data by applying generalized approximate message passing (GAMP) to solve an optimization problem which applies a Fourier transform and a wavelet transform to the k-space scan data. In some embodiments, the central control computer unit is further configured to generate a reconstructed image and a mean squared error (MSE) map based on the image dataset. In one embodiment, the system further includes a display configured to simultaneously present the reconstructed image and the MSE map.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses for performing Magnetic Resonance Imaging (MRI) reconstruction using Generalized Approximate Message Passing (GAMP) techniques. More specifically, in various embodiments described herein, GAMP is applied to solve a co-sparse optimization problem with a cost function that incorporates 1) the mismatch between the k-space measurements and the reconstructed image and 2) the sparsity of the image in the redundant Haar wavelet frame. The GAMP algorithm is capable of solving for both a maximum a posteriori (MAP) estimation and minimum mean square error (MSE) estimation of the image given measurements from an MRI scanner. Thus, using the techniques described herein, an image can be reconstructed along with a confidence map showing the likelihood that the data presented in the reconstructed image is correct. This map may be used during the algorithm to improve the convergence rate, but it may also be displayed to show how much confidence one can have in each part of the reconstructed image. Additionally, the message passing framework of GAMP can integrate the use of reference-based image quality metrics into the reconstruction objective itself. The approximate gaussianity of the intermediate steps of the GAMP algorithm also enables the use of automated parameter tuning based on Stein's Unbiased Risk Estimate (SURE), which may also improve both image quality and usability. The disclosed methods, systems and apparatuses may be methods, systems, and apparatuses that may be applied to various image reconstruction applications where sparse sampling techniques are used.

Figure 1:
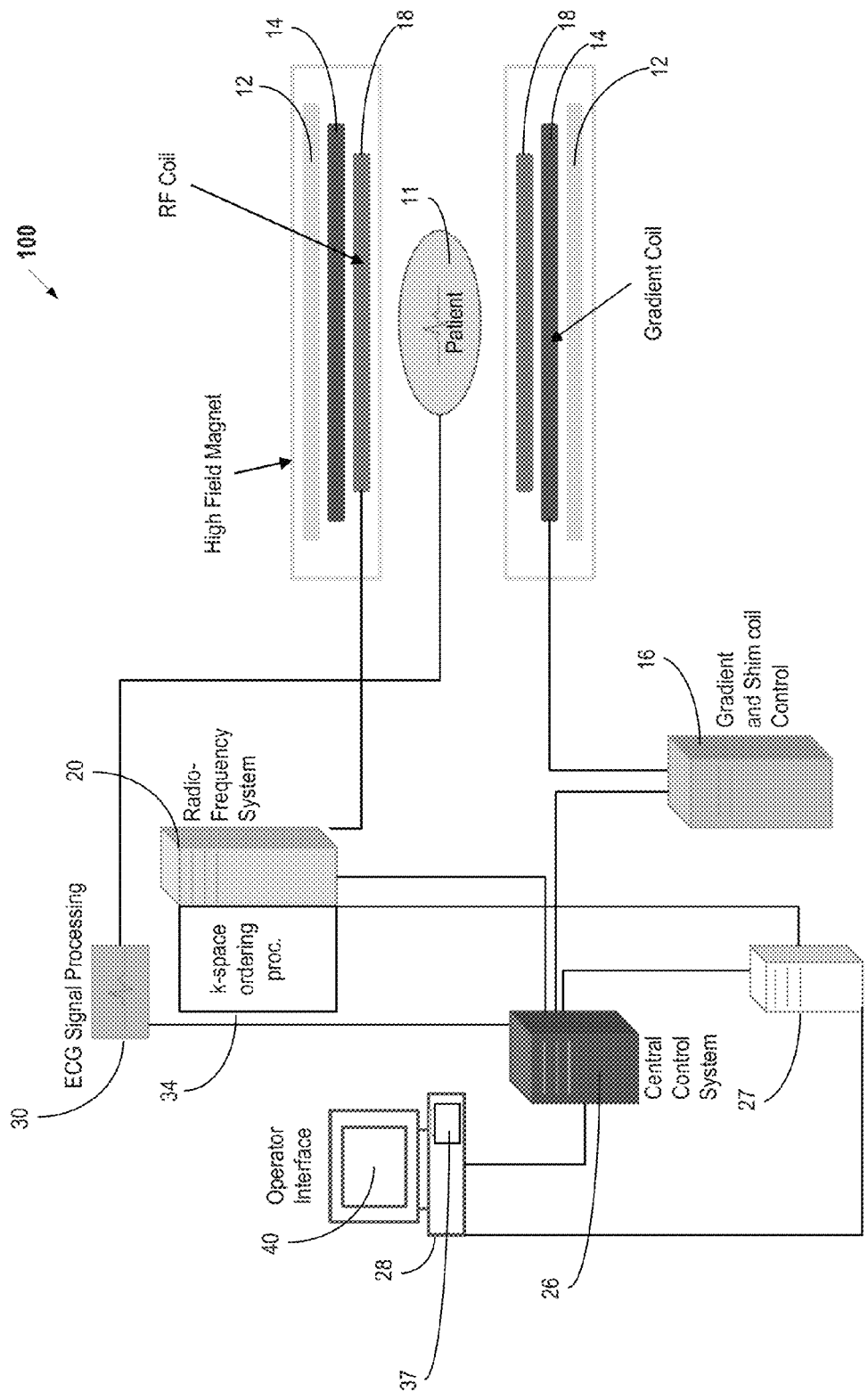
FIG. 1 shows a system for ordering acquisition of frequency domain components representing magnetic resonance (MR) image data for storage in a k-space storage array, as used by some embodiments of the present invention.

FIG. 1 shows a system 100 for ordering acquisition of frequency domain components representing MR image data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control unit 26 directs the various components of the system 100 to acquire radial k-space data using a Balanced Steady-State Free Precession (bSSFP) sequence with an interleaved-angle asymmetric radial sampling scheme.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, in conventional systems, an optimization algorithm is applied to iteratively solve a cost function which results in the reconstructed image. However, as explained in greater detail below, this technique has some drawbacks which are addressed herein with the introduction of a reconstruction algorithm based on message passing techniques.

MR image reconstruction may be viewed as a maximum a posteriori (MAP) estimation. A MAP estimate is a mode of the posterior distribution that can be used to estimate an unobserved quantity on the basis of empirical data. To fit MR reconstruction into the general paradigm of MAP estimations, reconstruction may be formulated as a statistical model. To illustrate, MR measurements may be acquired by the system 100 in k-space, with Gaussian noise according to the following equations:

$$y = Fx + \epsilon \quad (1)$$

$$\epsilon \sim \mathcal{N}(0, \sigma^2) \quad (2)$$

Here, the variable y represents the measurement from the MR scanner, while x represents the reconstructed image data. F is a measurement operator (a transform matrix) and $\epsilon$ is the noise, modeled here as a Gaussian distribution with a variance $\sigma^2$. The reconstruction model presented Equations (1) and (2) may be assigned the posterior distribution $p(x|y)$. Using this distribution, an estimator may be used to pose reconstruction as an optimization problem:

$$\hat{x} = \arg\min_x f(x, p(x|y)) \quad (3)$$

In practice, both the prior and the estimator are chosen so that the resulting optimization problem is tractable, e.g. MAP estimator and log-convex prior:

$$\hat{x} = \arg\min_x \left( \frac{1}{2\sigma^2} \|(y - Fx)\|_2^2 + \lambda \|Wx\|_1 \right) \quad (4)$$

where the $l_1$-norm of the signal in the transform domain is applied as a regularization term, with W representing the redundant Haar wavelet transform and $\lambda$ representing a regularization parameter governing the tradeoff between the data fidelity and its sparsity. However, note that the statistical distributions are not used at all in this equation. This potentially leads to a loss of information because the full posterior distribution is used to estimate a single "best" image. For example, error maps cannot be generated because information on the individual pixels is unavailable. To address the limitations of conventional optimization-based reconstruction scenarios, the distribution of each pixel may be estimated instead of a single "best" image. One way of performing such a reconstruction is through the use of Message Passing.

Message Passing (also referred to as "Belief Propagation") is a technique where optimization is performed over a Bayesian network to compute separable quantities. In this network, nodes are scalar variables and the edges are dependencies. This network can be adapted to estimate the marginal posteriors, the MAP estimator, or any other Bayesian estimator. During each iteration, each node sends its neighbors its current estimate of their value based on all its local information except the one sent by the recipient. Convergence is guaranteed if the undirected network has no cycle.

Message Passing is used in conventional applications such as in channel decoding, spin glass physics, and logic. The networks in those applications each share two qualities: their distributions can be represented by their histogram (i.e., the networks are quantized) and the number of messages only scales linearly with the system size (i.e., the networks are sparse). Neither of these qualities is present in CS MR Reconstruction. CS MR reconstruction uses numbers that are continuously valued up to the floating-point machine precision (i.e., they are not quantized). Also, in CS MR Reconstruction, the measurements and the reconstructed image are linked by a dense transformation matrix which has no zero coefficients. So, initially, it does not seem like a good candidate for application of the message passing. However, reconstruction may be implemented by approximating messaging behavior using the technique of Generalized Approximate Message Passing (GAMP).

GAMP is a technique generally known in the art of image processing that is modified herein for CS magnetic resonance applications. GAMP is a variation of a general technique referred to as Approximate Message Passing (AMP). AMP assumes the messages received by each node from its neighbors are approximately Gaussian and approximately equal. Distributions can be encoded by their mean and variance. At each iteration of the AMP calculation, the error between the current estimation and the solution is approximately Gaussian. If the sampling is dense enough, the message variances converge to the MSE map of the solution. AMP is designed for application on priors where coefficients that are Gaussian. GAMP provides the added benefit of modeling non-Gaussian noise. Thus, for example, using the technique described herein, the analysis sparsity operator W can be modeled as an extra measurement operator, with a sparse prior $$\mathcal{L}\left(0, \frac{1}{\lambda}\right).$$

Figure 2A:
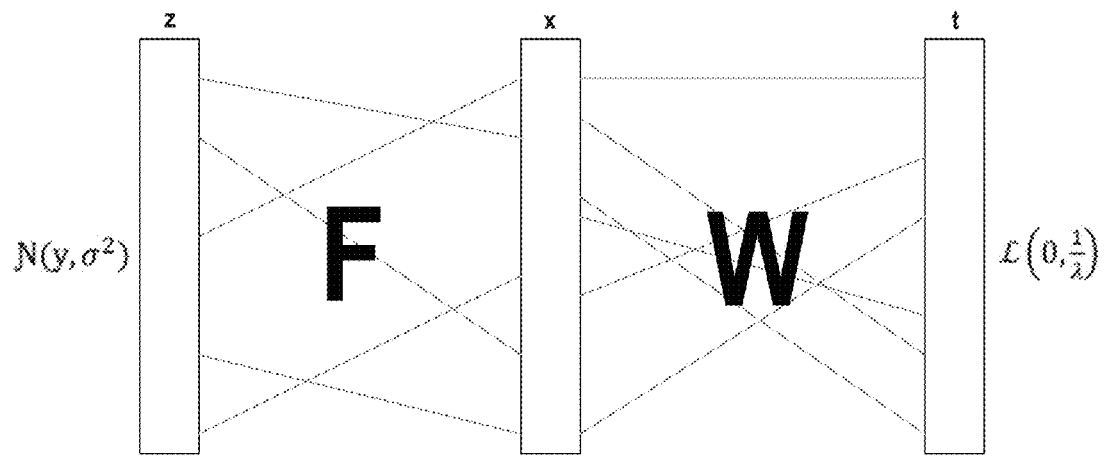
FIG. 2A provides a tri-party graph for conceptualizing how the algorithm is applied, according to some embodiments.

FIGS. 2A-2E provide an illustration of GAMP applied to reconstruct images from sparse MRI measurement, according to some embodiments of the present invention. FIG. 2A provides a tri-party graph for conceptualizing how the algorithm is applied. The graph includes two dependencies. First, the measurement z is linked to the reconstructed image x by a Fourier transform F. Second, the reconstructed image x is linked to the wavelet coefficients t by the regularization operator W. Additionally there are two priors: Gaussian noise $\mathcal{N}(y, \sigma^2)$ on the measurements and a Laplacian sparse prior $$\mathcal{L}\left(0, \frac{1}{\lambda}\right)$$

on the wavelet coefficients t. The density of the graph helps to compensate for the fact that the quantities to be estimated are not quantized. More specifically, as shown in the graph, a linear combination of a large number of variables is determined during each application of the operators F and W. The results are approximately Gaussian. So, even if the data is not quantized, one can approximate it with mean and variance. Additionally, the messages that will be broadcast are approximately the same. So, the algorithm can be similar to FISTA, but the mean of the distribution may be estimated along with variance (which, in turn, will produce the confidence map).

Figure 2B:
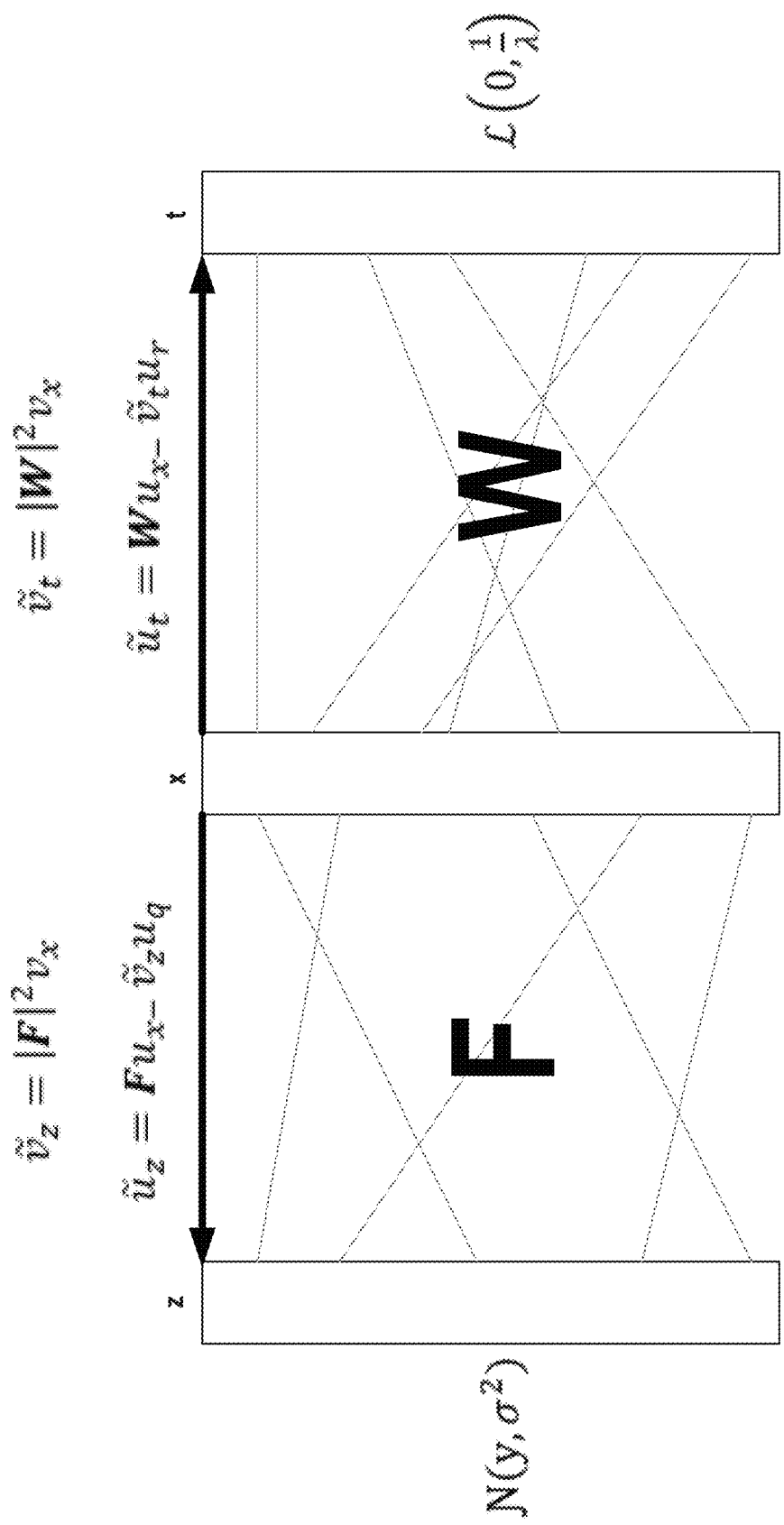
FIG. 2B shows the first step of the GAMP algorithm, following initialization of variables, according to some embodiments.

FIG. 2B shows the first step of the GAMP algorithm, following initialization of variables. The image distribution data is propagated to the transformed coefficients according to the following equations, applied to the data point-by-point:

$$\tilde{v}_z = |F|^2 v_x \quad (5)$$

$$\tilde{u}_z = F u_x - \tilde{v}_z u_q \quad (6)$$

$$\tilde{v}_t = |W|^2 v_x \quad (7)$$

$$\tilde{u}_t = W u_x - \tilde{v}_t u_r \quad (8)$$

In Equations (6) and (8), the terms $\tilde{v}_z u_q$ and $\tilde{v}_t u_r$ are the belief propagation terms, explained in greater detail below in the discussion of FIG. 2D. The tilde (i.e., ~) over the various belief propagation terms indicates that the algorithm should not consider a given pixel in this dataset when information is sent back to it. Following AMP, this is approximated by adding an Onsager term that is independent of the receiving pixel index, thus ensuring the complexity of one iteration remains linear in the data dimensions.

Figure 2C:
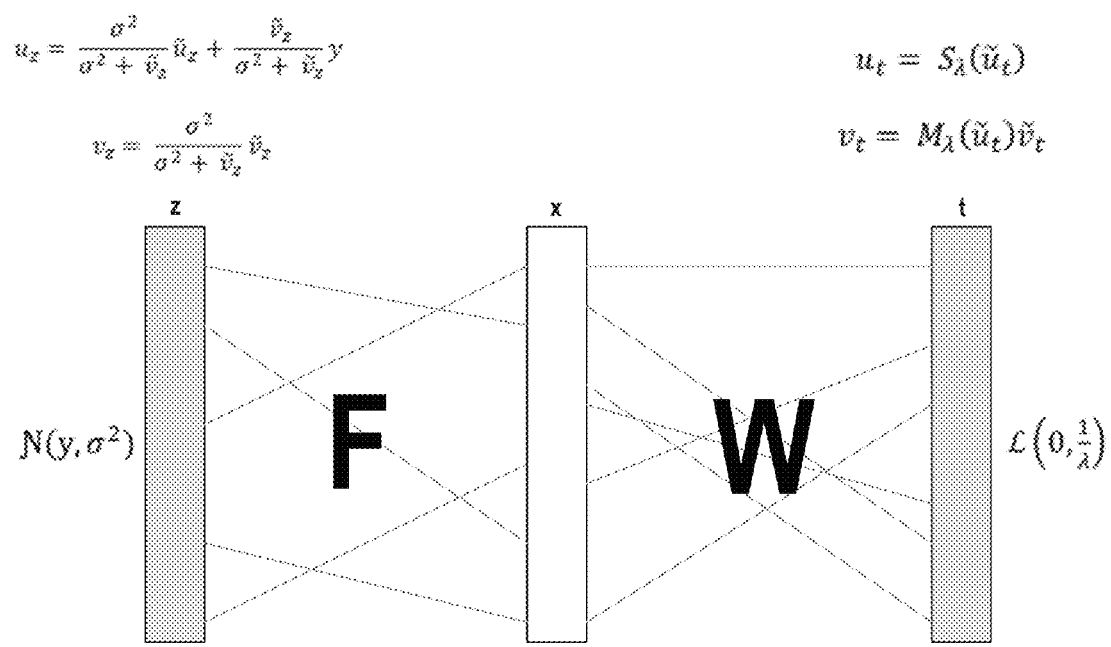
FIG. 2C shows the second step of the GAMP process where information from the priors is incorporated into the data coming from the neighbors, according to some embodiments.

FIG. 2C shows the second step of the GAMP process where information from the priors is incorporated into the data coming from the neighbors. In some embodiments, a linear filter is applied to incorporate the Gaussian noise $\mathcal{N}(y, \sigma^2)$ according to the following equations:

$$u_z = \frac{\sigma^2}{\sigma^2 + \tilde{v}_z} \tilde{u}_z + \frac{\tilde{v}_z}{\sigma^2 + \tilde{v}_z} y \quad (9)$$

$$v_z = \frac{\sigma^2}{\sigma^2 + \tilde{v}_z} \tilde{v}_z \quad (10)$$

In some embodiments, the Laplacian sparse prior $$\mathcal{L}\left(0, \frac{1}{\lambda}\right)$$

is incorporated into the data using a soft-thresholding operator S which applies a function that starts at 0 and moves linearly to the identity. When the variance is computed, the operator S must be differentiated. The resultant derivative is referred to herein, and in FIG. 2C, as "M." The M operator applies a function that starts at all 0s and goes to 1 at the point the change to point that S moves to the identity. The S and M operators may be applied to sparsity coefficients as follows:

$$u_t = S_\lambda(\tilde{u}_t) \quad (11)$$

$$v_t = M_\lambda(\tilde{u}_t)\tilde{v}_t \quad (12)$$

Figure 2D:
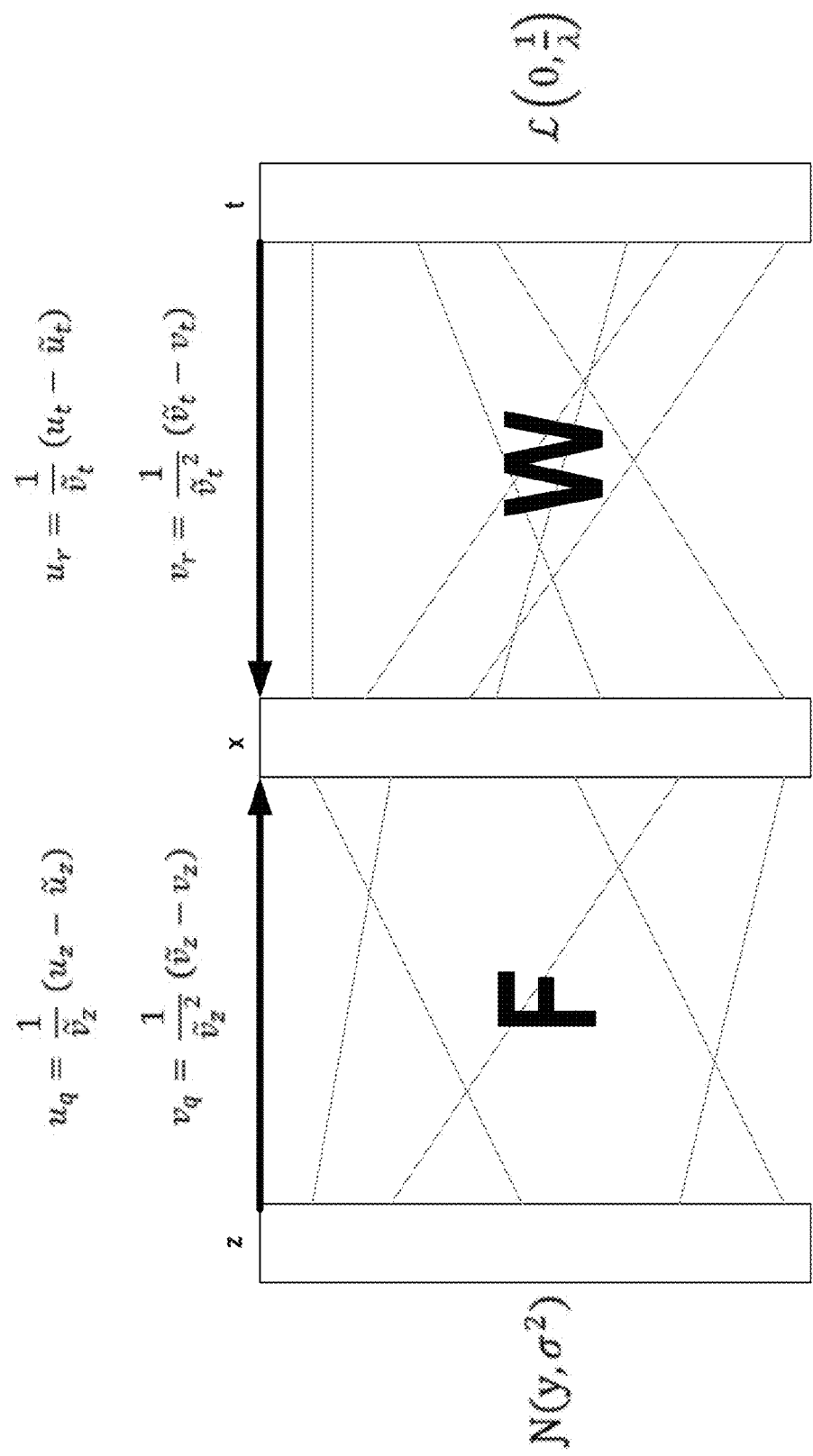
FIG. 2D shows the third step of the GAMP algorithm where, the belief propagation terms are propagated back to the pixels in estimated image, according to some embodiments.

FIG. 2D shows the third step of the GAMP algorithm where, the belief propagation terms are propagated back to the pixels in estimated image. As shown in FIG. 2D, this propagation may be performed via the following equations:

$$u_q = \frac{1}{\tilde{v}_z}(u_z - \tilde{u}_z) \quad (13)$$

$$v_q = \frac{1}{\tilde{v}_z^2}(\tilde{v}_z - v_z) \quad (14)$$

$$u_r = \frac{1}{\tilde{v}_t}(u_t - \tilde{u}_t) \quad (15)$$

$$v_r = \frac{1}{\tilde{v}_t^2}(\tilde{v}_t - v_t) \quad (16)$$

Figure 2E:
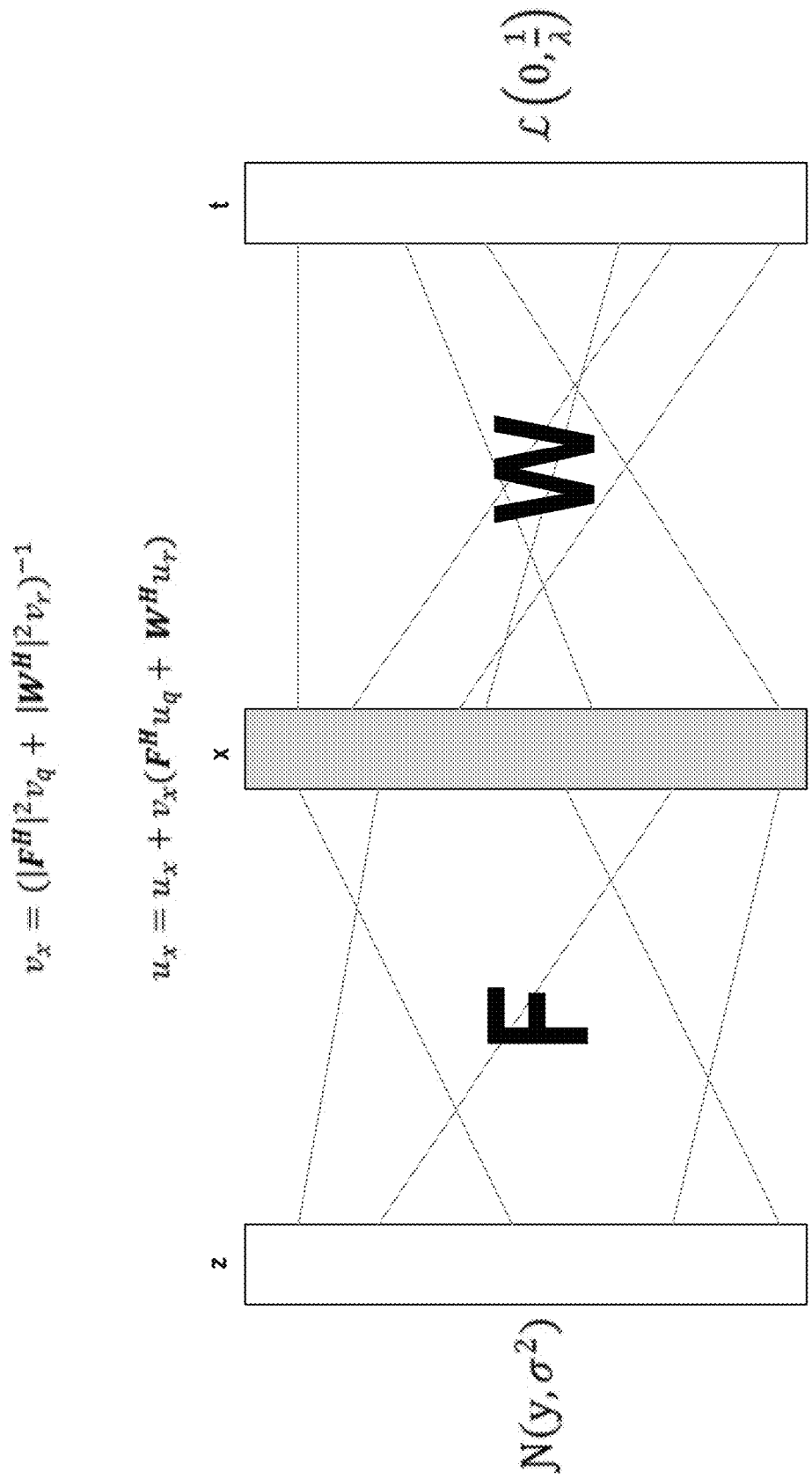
FIG. 2E shows the fourth step of the GAMP algorithm where the belief propagation information is used to update the pixel distributions of the reconstructed image according to some embodiments.

FIG. 2E shows the fourth step of the GAMP algorithm where the belief propagation information is used to update the pixel distributions of the reconstructed image according to the following equations:

$$v_x = (|F^H|^2 v_q + |W^H|^2 v_r)^{-1} \quad (17)$$

$$u_x = u_x + v_x(F^H u_q + W^H u_r) \quad (18)$$

The algorithm then continues back at the first step, until convergence or until a desired number of iterations has been performed. The end result of the algorithm is a reconstructed image and an estimate of the noise level of the image which may be used to generate a confidence map of the data.

The GAMP technique described herein provides various benefits over conventional reconstruction algorithms. For example, message passing gives you a way to tune step size. Since, step size is related to variance, each step of the algorithm can be designed to proceed optimally based on the current noise level, thereby leading to faster convergence. Also, the structure of the algorithm is simpler. At each iteration, there are only 4 operators applied: one Fourier transform, one Fourier transform adjoint, one Wavelet transform, one Wavelet transform adjoint. So, the total cost of the algorithm can be directly determined since the message passing only calculates each operator once during each iteration. Conversely, in conventional reconstruction scenarios where optimization algorithms are used and each iteration of the algorithm may entail as many applications of an operator as needed for convergence.

Figure 3:
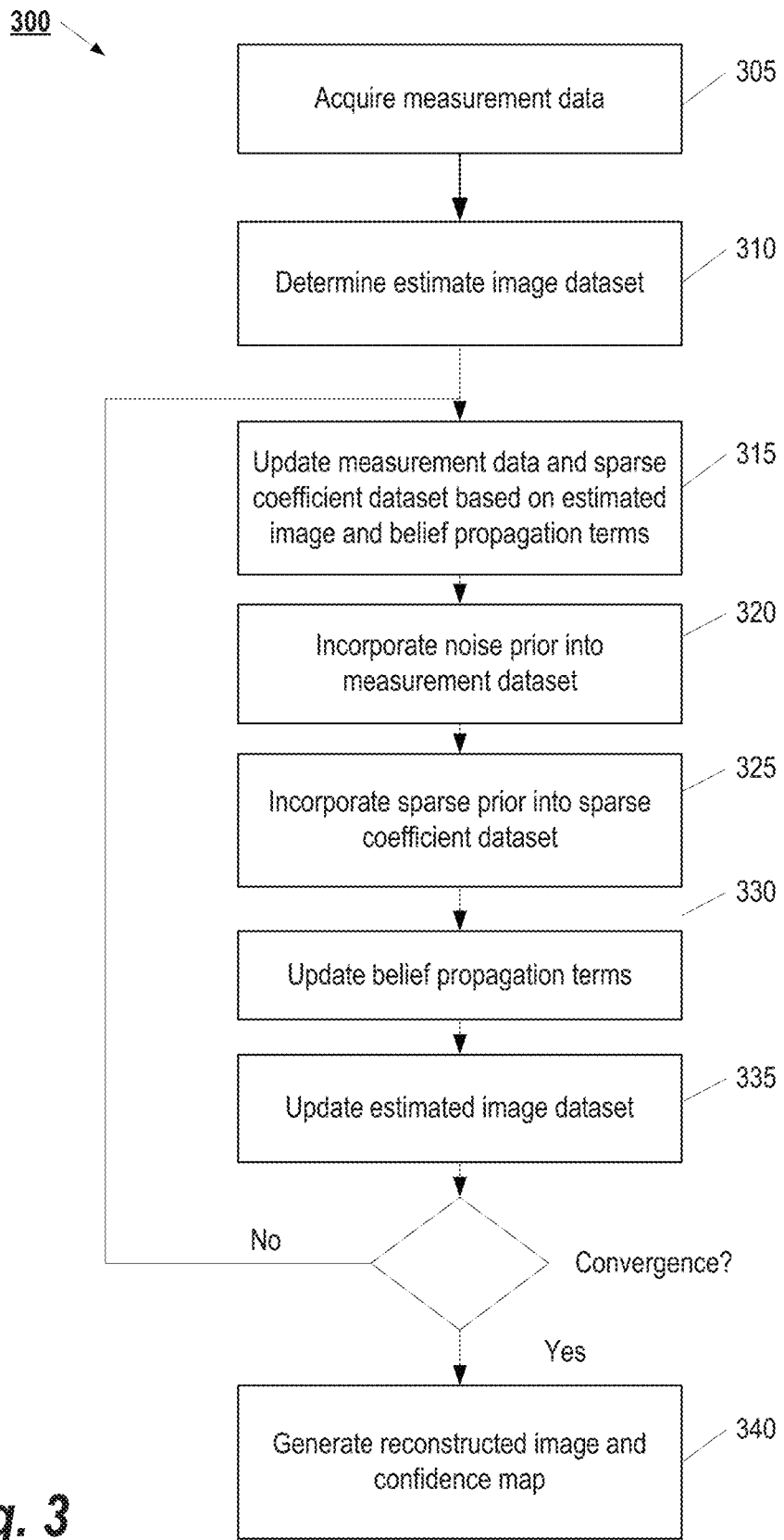
FIG. 3 provides a summary overview of a method for reconstructing magnetic resonance imaging data using GAMP, according to some embodiments.

FIG. 3 provides a summary overview of a method 300 for reconstructing magnetic resonance imaging data using GAMP, according to some embodiments. At 305, a measurement dataset is acquired using an MRI device (see, e.g., FIG. 1) using any technique generally known in the art. In some embodiments, prior to 305, one or more low-quality reference scans may be performed to estimate coil sensitivities corresponding to the MRI device. The coil sensitivity information may then be incorporated into the reconstruction calculations using one or more additional terms in the equations processed during each iteration. For simplicity, such additional processing has been omitted from the example method 300 illustrated in FIG. 3.

Continuing with reference to FIG. 3, at 310, an estimated image dataset is determined by applying an operator (e.g., Fourier transform) to the measurement dataset. Next, at 315-340, an iterative reconstruction process is performed to refine the estimated image dataset. At 315, the measurement dataset and a sparse coefficient dataset are updated based on the estimated image dataset and a plurality of belief propagation terms. Next, at 320, a noise prior dataset is incorporated into the measurement dataset, for example, using a MAP estimation process. At 325, a sparsity prior dataset is incorporated into the sparse coefficient dataset. Next, at 330, the belief propagation terms are updated based on the measurement dataset and the sparsity prior dataset. Then, at 335 the estimated image dataset is updated based on the plurality of belief propagation terms. Finally, at 340, a reconstructed image and confidence map are generated using the estimated image dataset. The reconstructed image and confidence map may then be presented (e.g., side-by-side) on a display and/or stored for later retrieval and viewing.

Figure 4A:
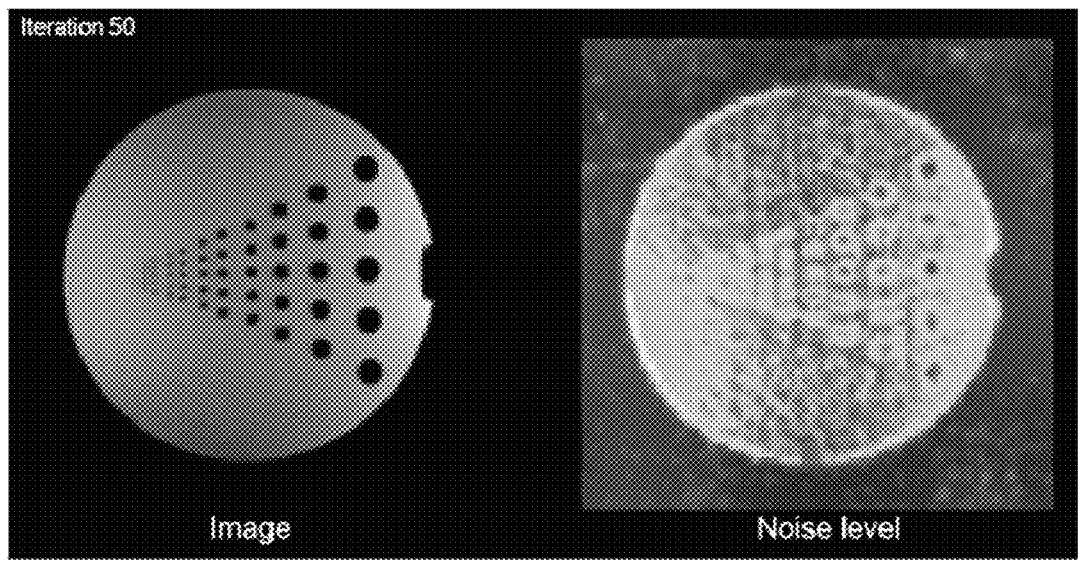
FIG. 4A provides an example of the reconstructed image and the corresponding noise level generated by 50 iterations of the reconstruction algorithm, according to some of the embodiments described herein.
Figure 4B:
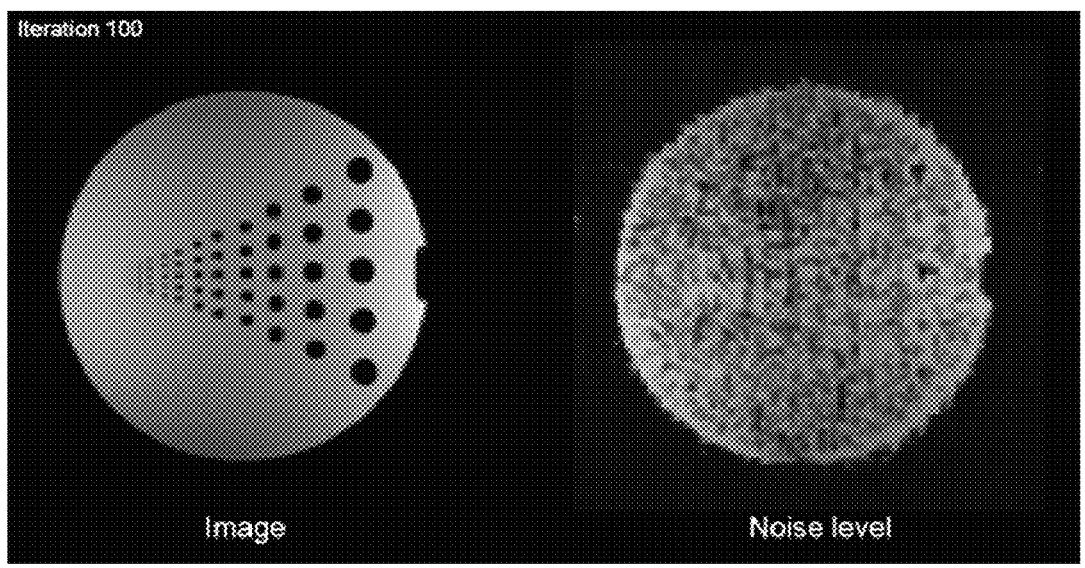
FIG. 4B provides an example of the reconstructed image and the corresponding noise level generated by 100 iterations of the reconstruction algorithm, according to some of the embodiments described herein.

FIGS. 4A and 4B provide examples of the reconstructed image and the corresponding noise level (i.e., confidence map) generated for example measurements, according to some of the embodiments described herein. This provides one example of how the reconstructed data may be presented to physicians, with reconstructed images presented side-by-side with images depicting the noise level of the data. The noise level image allows a physician to quickly see whether a particular item in the image (e.g., a suspected lesion) is not an artifact. FIG. 4A shows the results for 50 iterations of the algorithm, while FIG. 4B shows the results for 100 iterations. Note that when the iterations increase, the noise level goes down and it becomes non-uniform. As the image sharpens, the algorithm shows that the edges have more uncertainty. This type of noise level information is unavailable in compressed sensing reconstruction algorithms such as FISTA.

Figure 5:
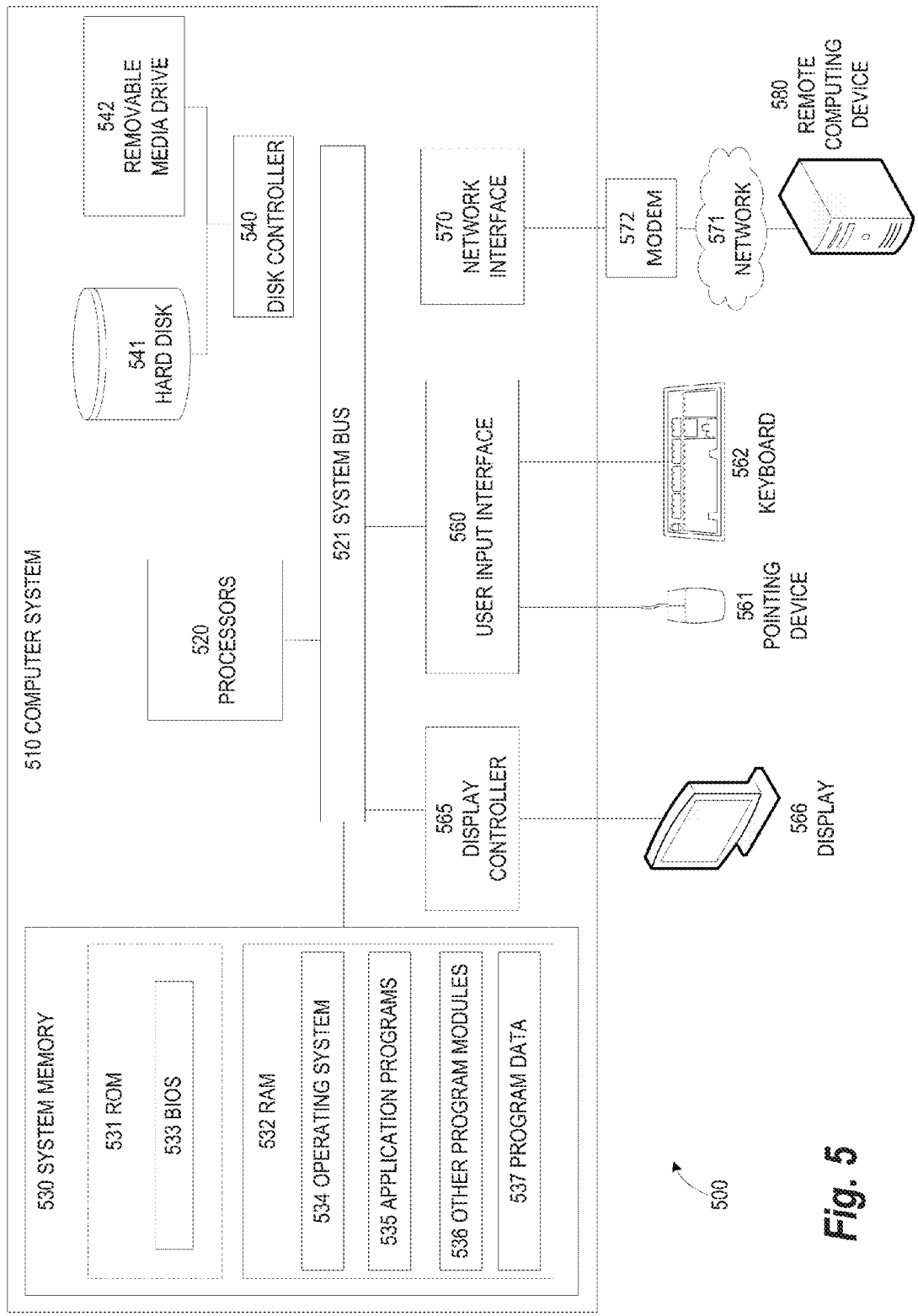
FIG. 5 illustrates an exemplary computing environment within which embodiments of the invention may be implemented.

FIG. 5 illustrates an exemplary computing environment 500 within which embodiments of the invention may be implemented. For example, this computing environment 500 may be used to implement the method 300 of imager reconstruction described in FIG. 3. In some embodiments, the computing environment 500 may be used to implement one or more of the components illustrated in the system 100 of FIG. 1. The computing environment 500 may include computer system 510, which is one example of a computing system upon which embodiments of the invention may be implemented. Computers and computing environments, such as computer system 510 and computing environment 500, are known to those of skill in the art and thus are described briefly here.

As shown in FIG. 5, the computer system 510 may include a communication mechanism such as a bus 521 or other communication mechanism for communicating information within the computer system 510. The computer system 510 further includes one or more processors 520 coupled with the bus 521 for processing the information. The processors 520 may include one or more central processing units (CPUs), graphical processing units (GPUs), or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device (s) (e.g., programmable ROM, erasable PROM, and electrically erasable PROM). In addition, the system memory 530 may be used for storing temporary variables or other intermediate information during the execution of instructions by the processors 520. A basic input/output system 533 (BIOS) containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display 566, such as a cathode ray tube (CRT) or liquid crystal display (LCD), for displaying information to a computer user. The computer system includes an input interface 560 and one or more input devices, such as a keyboard 562 and a pointing device 561, for interacting with a computer user and providing information to the processor 520. The pointing device 561, for example, may be a mouse, a trackball, or a pointing stick for communicating direction information and command selections to the processor 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any medium that participates in providing instructions to the processor 520 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 510 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computer 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for.

We claim:

1. A method for reconstructing magnetic resonance imaging data, the method comprising:
    acquiring a measurement dataset using a magnetic resonance imaging device;
    determining an estimated image dataset based on the measurement dataset;
    performing an iterative reconstruction process to refine the estimated image dataset, wherein each iteration of the iterative reconstruction process comprises:
        updating the measurement dataset and a sparse coefficient dataset based on the estimated image dataset and a plurality of belief propagation terms, wherein the sparse coefficient dataset comprises mean sparse coefficient data and variance sparse coefficient data,
        incorporating a noise prior dataset into the measurement dataset,
        incorporating a sparsity prior dataset into the sparse coefficient dataset by (a) updating the mean sparse coefficient data by applying a soft thresholding operator to the mean sparse coefficient data and (b) updating the variance sparse coefficient data by applying a derivative soft thresholding operator to the mean sparse coefficient data,
        updating the plurality of belief propagation terms based on the measurement dataset and the sparsity prior dataset, and
        updating the estimated image dataset based on the plurality of belief propagation terms; and
    generating a reconstructed image and confidence map using the estimated image dataset.

2. The method of claim 1, wherein the measurement dataset comprises mean measurement data and variance measurement data.

3. The method of claim 2, wherein updating measurement dataset based on the estimated image dataset and the plurality of belief propagation terms by a process comprises:
    determining the mean measurement data based on a mean of the estimated image dataset; and
    determining the variance measurement data based on a variance of the estimated image dataset and one or more of the plurality of belief propagation terms.

4. The method of claim 2, wherein incorporating the noise prior dataset into the measurement dataset is performed using a maximum a posteriori probability (MAP) estimation process.

5. The method of claim 1, wherein updating sparse coefficient dataset based on the estimated image dataset and the plurality of belief propagation terms by a process comprises:
    determining the mean sparse coefficient data based on a mean of the estimated image dataset; and
    determining the variance sparse coefficient data based on a variance of the estimated image dataset and one or more of the plurality of belief propagation team.

6. The method of claim 1, wherein the plurality of belief propagation terms comprise:
    a first belief propagation term corresponding to mean measurement data;
    a second belief propagation term corresponding to variance measurement data;
    a third belief propagation term corresponding to mean sparse coefficient data; and
    a fourth belief propagation term corresponding to variance sparse coefficient data.

7. The method of claim 1, wherein the estimated image dataset comprises mean estimated image data and variance estimated image data.

8. The method of claim 7, wherein the updating of the estimated image dataset based on the plurality of belief propagation terms comprises:
    updating the mean estimated image data by applying a first transform operator to a first belief propagation term and a second transform operator to a second belief propagation teem; and
    updating the variance estimated image data by applying the first transform operator to a third belief propagation term and the second transform operator to a fourth belief propagation term and multiplying by the mean estimated image data.

9. The method of claim 8, wherein the first transform operator is an adjoint of a Fourier transform operator and the second transform operator is an adjoint of a wavelet transform operator.

10. The method of claim 7, wherein the reconstructed image is generated based on the mean estimated image data and the confidence map is generated based on the variance estimated image data.

11. A method for reconstructing magnetic resonance imaging data, the method comprising:
   obtaining k-space scan data captured by a MRI system, the k-space scan data being representative of an undersampled region over time; and
   reconstructing an image dataset from the k-space scan data by applying generalized approximate message passing (GAMP) to solve an optimization problem which applies a Fourier transform and a wavelet transform to the k-space scan data, wherein GAMP is applied to solve the optimization problem by a process comprising:
   determining a plurality of image distribution values based on the k-space scan data;
   determining a plurality of measurement coefficient values using the plurality of image distribution values and a first belief propagation correction term;
   incorporating a first prior data value into the plurality of measurement coefficient values;
   determining a plurality of sparse coefficient values using the plurality of image distribution values and a second belief propagation correction term;
   incorporating a second prior data value into the plurality of sparse coefficient values; and
   updating the plurality of image distribution values based on the plurality of measurement coefficient values and the plurality of sparse coefficient values.

12. The method of claim 11, wherein the image dataset comprises a reconstructed image and a mean squared error (MSE) map.

13. The method of claim 11, wherein the first prior data value is incorporated into the plurality of measurement coefficient values using a maximum a posteriori (MAP) probability estimate.

14. The method of claim 13, wherein the first prior data value comprises a Gaussian distribution of a noise and the second prior data value comprises a Laplacian distribution of a regularization term.

15. A system for reconstructing magnetic resonance imaging data, the system comprising:
   an imaging device comprising a plurality of coils configured to acquire k-space scan data representative of an undersampled region over time; and
   a central control computer unit configured to reconstruct an image dataset from the k-space scan data by applying generalized approximate message passing (GAMP) to solve an optimization problem which applies a Fourier transform and a wavelet transform to the k-space scan data, wherein the central control computer unit applies GAMP is applied using a process comprising:
   determining a plurality of image distribution values based on the k-space scan data,
   determining a plurality of measurement coefficient values using the plurality of image distribution values and a first belief propagation correction term,
   incorporating a first prior data value into the plurality of measurement coefficient values;
   determining a plurality of sparse coefficient values using the plurality of image distribution values and a second belief propagation correction term,
   incorporating a second prior data value into the plurality of sparse coefficient values, and
   updating the plurality of image distribution values based on the plurality of measurement coefficient values and the plurality of sparse coefficient values.

16. The system of claim 15, wherein the central control computer unit is further configured to:
   generate a reconstructed image based on the image dataset; and
   generate a mean squared error (MSE) map based on the image dataset.

17. The system of claim 16, further comprising:
   a display configured to simultaneously present the reconstructed image and the MSE map.

* * * * *